(12) United States Patent
Dunham

(10) Patent No.: US 7,719,843 B2
(45) Date of Patent: May 18, 2010

(54) MULTIPLE DRIVE PLUG-IN CABLE

(75) Inventor: John Dunham, Kechi, KS (US)

(73) Assignee: LSI Corporation, Milpitas, CA (US)

( * ) Notice: Subject to any disclaimer, the term of this patent is extended or adjusted under 35 U.S.C. 154(b) by 168 days.

(21) Appl. No.: 11/879,602

(22) Filed: Jul. 17, 2007

(65) Prior Publication Data
US 2009/0021905 A1    Jan. 22, 2009

(51) Int. Cl.
*G06F 1/16* (2006.01)
(52) U.S. Cl. ............ 361/725; 361/679.33; 361/679.37; 361/724; 312/223.1; 312/223.2
(58) Field of Classification Search .................. None
See application file for complete search history.

(56) References Cited

U.S. PATENT DOCUMENTS

| | | | |
|---|---|---|---|
| 6,459,571 B1 * | 10/2002 | Carteau | 361/684 |
| 7,095,616 B2 * | 8/2006 | Soeda et al. | 361/724 |
| 7,136,962 B2 * | 11/2006 | Sugimoto | 711/112 |
| 2003/0235320 A1 * | 12/2003 | Hirschhorn | 381/333 |
| 2007/0081308 A1 * | 4/2007 | Ishida | 361/724 |
| 2008/0055846 A1 * | 3/2008 | Clidaras et al. | 361/687 |

* cited by examiner

*Primary Examiner*—Jayprakash N Gandhi
*Assistant Examiner*—Anthony Q Edwards
(74) *Attorney, Agent, or Firm*—Suiter Swantz pc llo

(57) ABSTRACT

The present invention enables assembly of drive boxes that stack drives more than one drive deep without requiring large numbers of PC boards or that the drive box to be pulled out of a rack to remove/replace the drives. A shielded multiple drive plug-in cable connects a single PC board to a plurality of drives in the drive box. The multiple drive plug-in cable provides power from the PC board to the drives and/or passes signal between the PC board and the drives. The multiple drive plug-in cable is configured to occupy a minimal cross-sectional area in order to maximize air flow within the drive box. The present invention reduces the cost of manufacturing the drive box, reduces EMI (electromagnetic interference), and prevents drops in signal integrity by reducing the number of PC boards required for a drive box.

2 Claims, 5 Drawing Sheets

MULTIPLE DRIVE PLUG-IN CABLE

FIELD OF THE INVENTION

This invention relates generally to the field of computer systems and configurations, and particularly to a multiple drive plug-in cable for data storage systems.

BACKGROUND OF THE INVENTION

Drive boxes for information handling systems that stack drives more than one drive deep typically require large numbers of PC boards (printed circuit boards) and connections to PC boards. PC boards are not shielded as well as shielded cables (electrical cable of one or more insulated conductors enclosed by a common conductive layer) and signal integrity drops much faster than in cables.

A PC board which reaches drives in both front and back of each other causes the costs of manufacturing to greatly increase. A way to fix this problem is to change how drives are assembled into a drive box. Often the drives are assembled in a drive box which is mounted on a rack of an information handling system where the whole drive box must be pulled out to remove or replace the drives. If the drive box has to be pulled out of the rack to remove the drives, slides have to be added as well as structure to support a large drive box full of drives handing out like a drawer in front of the rack. This can also cause cabling problems in the back of the box as the cables are pulled forward when the box is pulled out of the rack. Another solution is to utilize a large number of PC boards to connect all the drives together. However, by connecting the drives with a large number of PC boards, signal integrity is reduced and costs are increased. Further, electromagnetic interferences (EMI) are created by the PC boards, which are not shielded as well as shielded cables.

Therefore, it would be desirable to provide a solution which addresses the above-referenced problems and limitations of the current solutions.

SUMMARY OF THE INVENTION

Accordingly, the present invention provides a drive box, as well as a multiple drive plug-in cable which enables assembly of the drive box, that stacks drives more than one drive deep without requiring large numbers of PC boards or without requiring that the drive box to be pulled out of the rack to remove or replace the drives. The drive box may be mounted on the rack of an information handling system. The drive box includes a plurality of drives. The drives may be hot-swappable. The multiple drive plug-in cable connects a single PC board to the plurality of drives in the drive box.

The multiple drive plug-in cable may provide power from the PC board to the drives in the plurality of drives. The multiple drive plug-in cable may pass signals between the PC board and the drives in the plurality of drives. The multiple drive plug-in cable may provide power from the PC board to the drives in the plurality of drives and pass signals between the PC board and the drives in the plurality of drives. The multiple drive plug-in cable may comprise a shielded cable. The multiple drive plug-in cable may be configured to occupy a minimal cross-sectional area in order to maximize air flow within the drive box.

The present invention allows for assembly of drive boxes that stack drives more than one drive deep without requiring large numbers of PC boards or without requiring that the drive box to be pulled out of the rack to remove or replace the drives. The multiple drive plug-in cable of the present invention reduces the cost of manufacturing the drive box, reduces EMI electromagnetic interference), and prevents reduction in signal integrity by reducing the number of PC boards required for a drive box. Further, utilization of shielding in the multiple drive plug-in cable of the present invention further reduces EMI.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
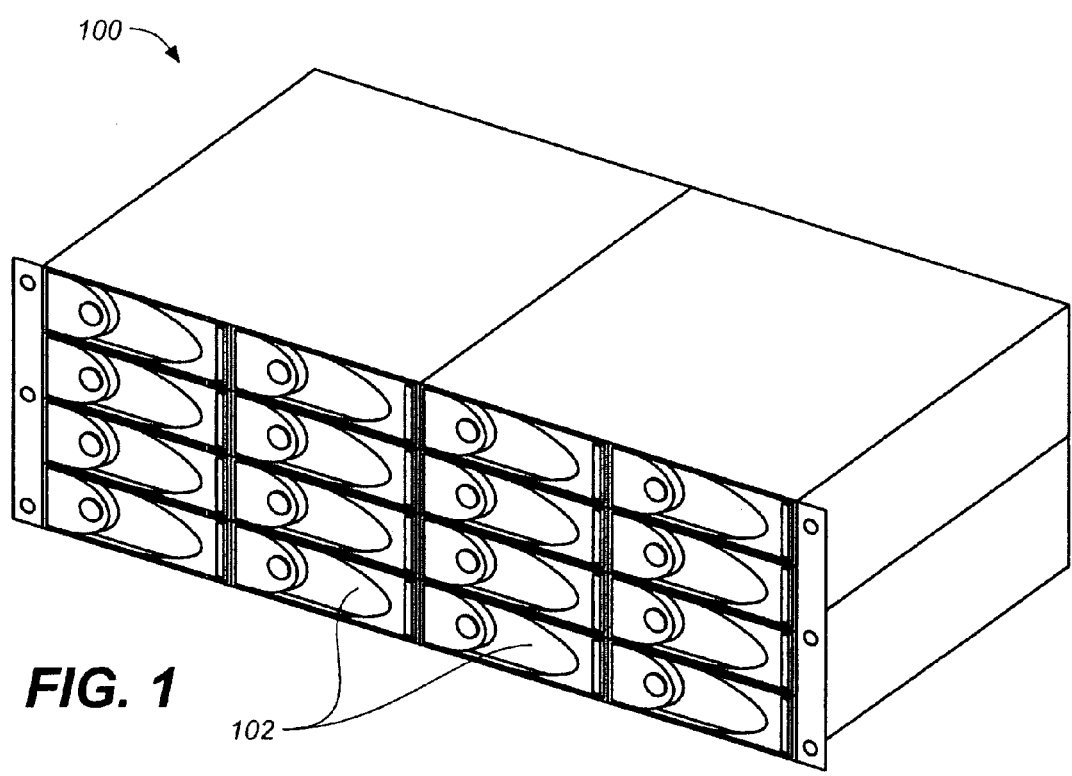
FIG. 1 is an isometric view of a drive box for an information handling system, in accordance with an exemplary embodiment of the present invention.

FIG. 1 illustrates a drive box 100 for an information handling system, in accordance with an exemplary embodiment of the present invention. Drive box 100 includes a plurality of drives 102. The drives 102 in the plurality of drives 102 may comprise any kind of drives including, but not limited to hard disk drives, optical disk drives, floppy disk drives, tape drives, and any other variety of drives. The drives 102 in the plurality of drives 102 may be hot-swappable (the drives 102 may be removed or replaced while the drive box 100 is in operation).

Figure 2:
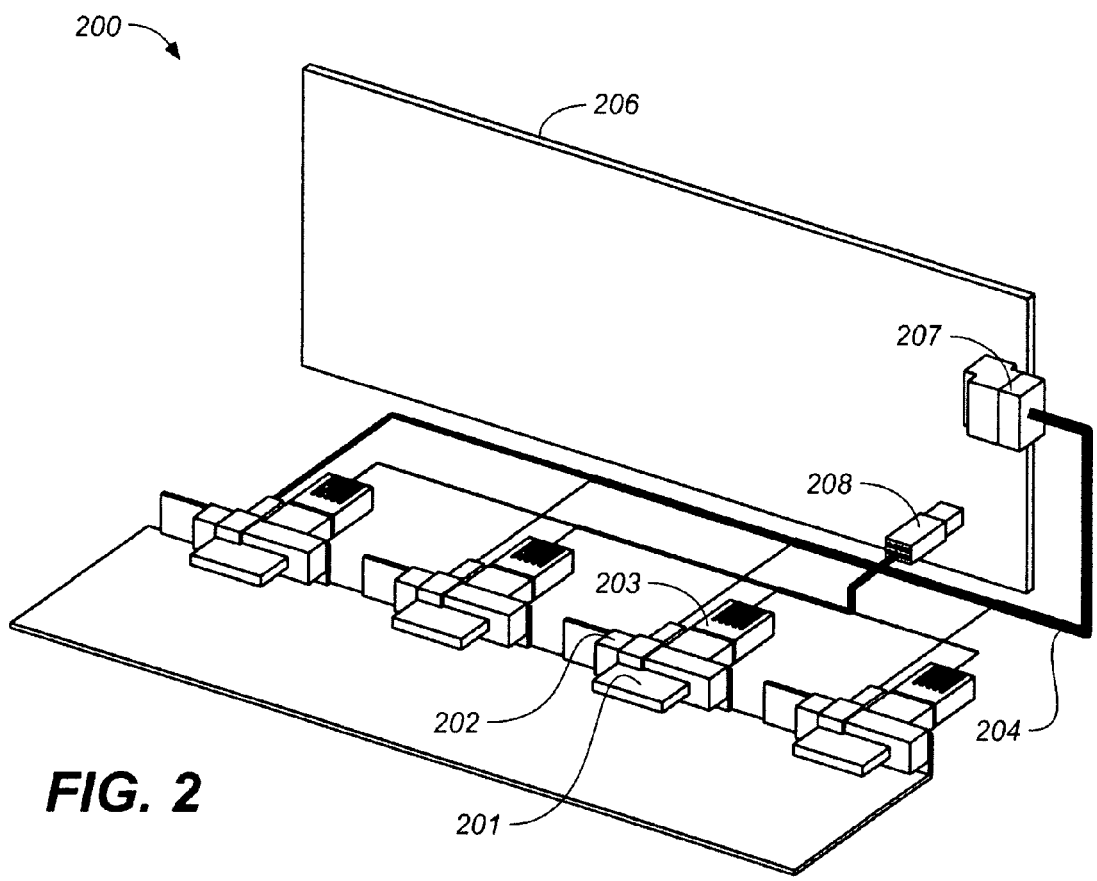
FIG. 2 is a partial internal isometric view of drive box for an information handling system, in accordance with an exemplary embodiment of the present invention.

Referring to FIG. 2, a partial internal view 200 of the drive box 100 for an information handling system, in accordance with an exemplary embodiment of the present invention, is illustrated. Drive box 100 may include drive plugs 201 into which the drives 102 in the plurality of drives 102 plug. Also illustrated is the PC (printed circuit) board 206 internal to the drive box 100 and the multiple drive plug-in cable 204 which connects the drive plugs 201 for the plurality of drives 102 to the PC board 206. The multiple drive plug-in cable 204 includes drive connectors 202 and 203 which connect the multiple drive plug-in cable 204 to the drive plugs 201 and PC board connectors 207 and 208 which connect the multiple drive plug-in cable 204 to the PC board 206. By utilizing the multiple drive plug-in cable 204, a plurality of drives 102 in the drive box 100 are able to be connected to a single PC board 206.

The multiple drive plug-in cable 204 may provide power from the PC board to the drives 102 in the plurality of drives 102. The multiple drive plug-in cable 204 may pass signals between the PC board and the drives 102 in the plurality of drives 102. The multiple drive plug-in cable 204 may provide power from the PC board to the drives in the plurality of drives 102 and pass signal between the PC board and the drives 102 in the plurality of drives.

The multiple drive plug-in cable 204 may comprise a shielded cable. The shield for the shielded cable may comprise braided strands of metal (including, but not limited to, copper), one or more non-braided spiral windings of metal (including, but not limited to, copper) tape, or one or more layers of conductive polymer. Because of the shielding, a shielded cable may emit less EMI (electromagnetic interference) than a cable which is not shielded.

The multiple drive plug-in cable 204 is illustrated as comprising two distinct cable components. One cable component may provide power and the other may pass signals. However, the multiple drive plug-in cable 204 may comprise greater or lesser numbers of cable components without departing from the scope of the present invention. The multiple drive plug-in cable also may comprise multiple cables melded together or multiple conductors housed within a cable housing without departing from the scope of the present invention. The multiple drive plug-in cable 204 is illustrated as including two separate drive connectors 202 and 203, which connect to the drive plugs 201, and two separate PC board connectors 207 and 208, which connect to the PC board 206. However, the multiple drive plug-in cable 204 may include greater or lesser numbers of drive connectors 202 and 203 and/or greater or lesser numbers of PC board connectors 207 and 208 without departing from the scope of the present invention.

The multiple drive plug-in cable 204 may be configured to occupy a minimal cross-sectional area. For example, the multiple drive plug-in cable 204 may be configured to minimize the thickness and width along the length of the multiple drive plug-in cable 204. In this fashion, the multiple drive plug-in cable 204 may occupy a minimal amount of area within the drive box 100. By occupying a minimal amount of area within the drive box 100, the multiple drive plug-in cable 204 may maximize air flow within the drive box 100.

Figure 3:
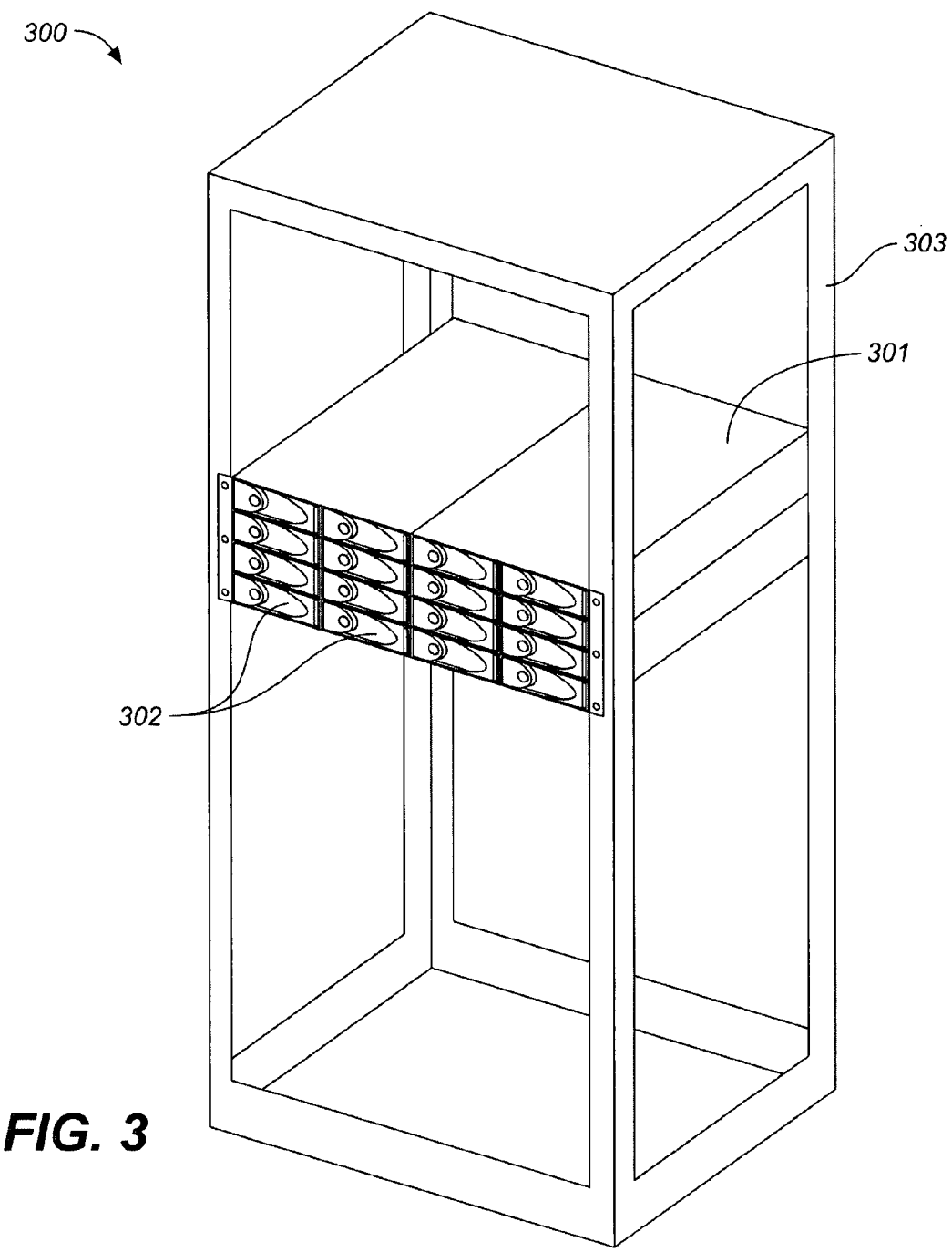
FIG. 3 is an isometric view of a drive box mounted on the rack of an information handling system, in accordance with an exemplary embodiment of the present invention.

Referring to FIG. 3, a drive box 301 for an information handling system, in accordance with an exemplary embodiment of the present invention, is shown mounted on the rack 303 of an information handling system 300.

Figure 4:
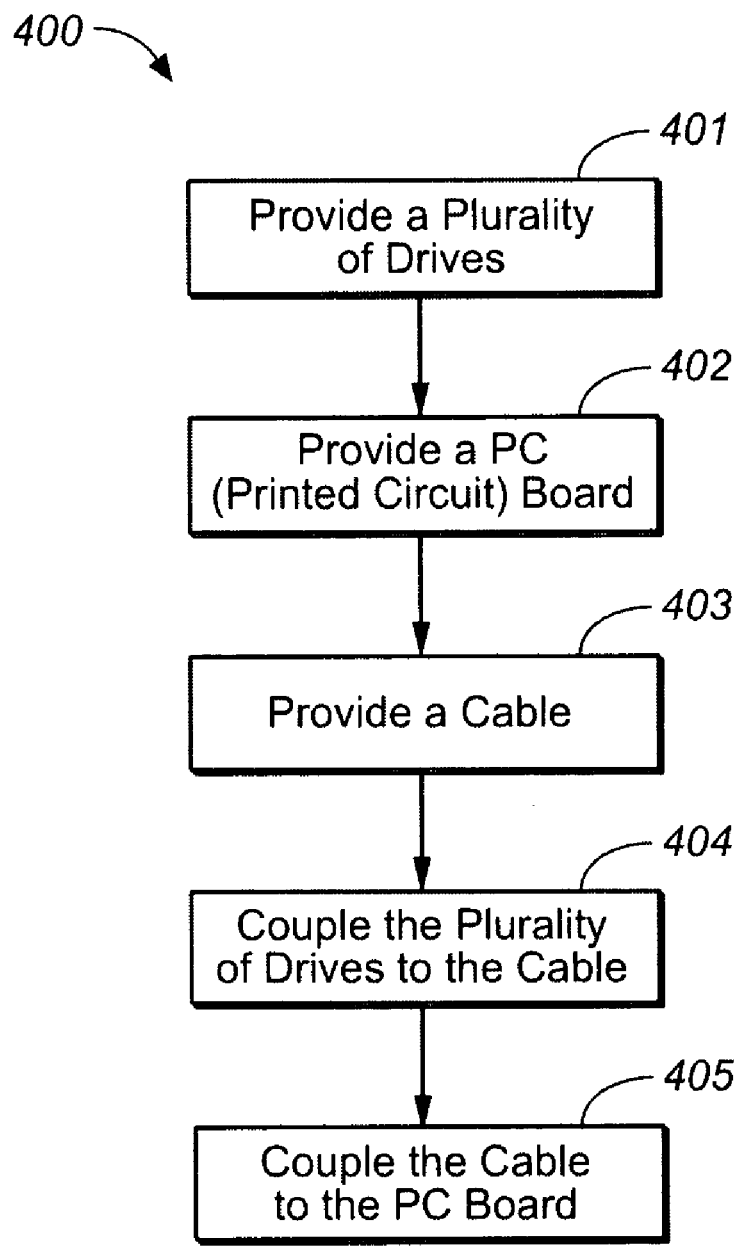
FIG. 4 is a flow chart of a method for providing a drive box for an information handling system, in accordance with an exemplary embodiment of the present invention.

Referring now to FIG. 4, a method 400 for providing a drive box for an information handling system, in accordance with an exemplary embodiment of the present invention, is illustrated. In step 401, a plurality of drives is provided. The drives in the plurality of drives may comprise any kind of drives including, but not limited to hard disk drives, optical disk drives, floppy disk drives, tape drives, and drives. In step 402, a PC board is provided. In step 403, a multiple drive plug-in cable is provided. The multiple drive plug-in cable may comprise a shielded cable. The multiple drive plug-in cable may be configured to occupy a minimal cross-sectional area in order to maximize air flow within the drive box. In step 404, the multiple drive plug-in cable is coupled to the plurality of drives. In step 405, the multiple drive plug-in cable is coupled to the PC board. The multiple drive plug-in cable may be operable to provide power from the PC board to the plurality of drives. The multiple drive plug-in cable may be operable to pass signal between the PC board and the plurality of drives. The multiple drive plug-in cable may be operable to provide power from the PC board to the plurality of drives and to pass signal between the PC board and the plurality of drives.

Figure 5:
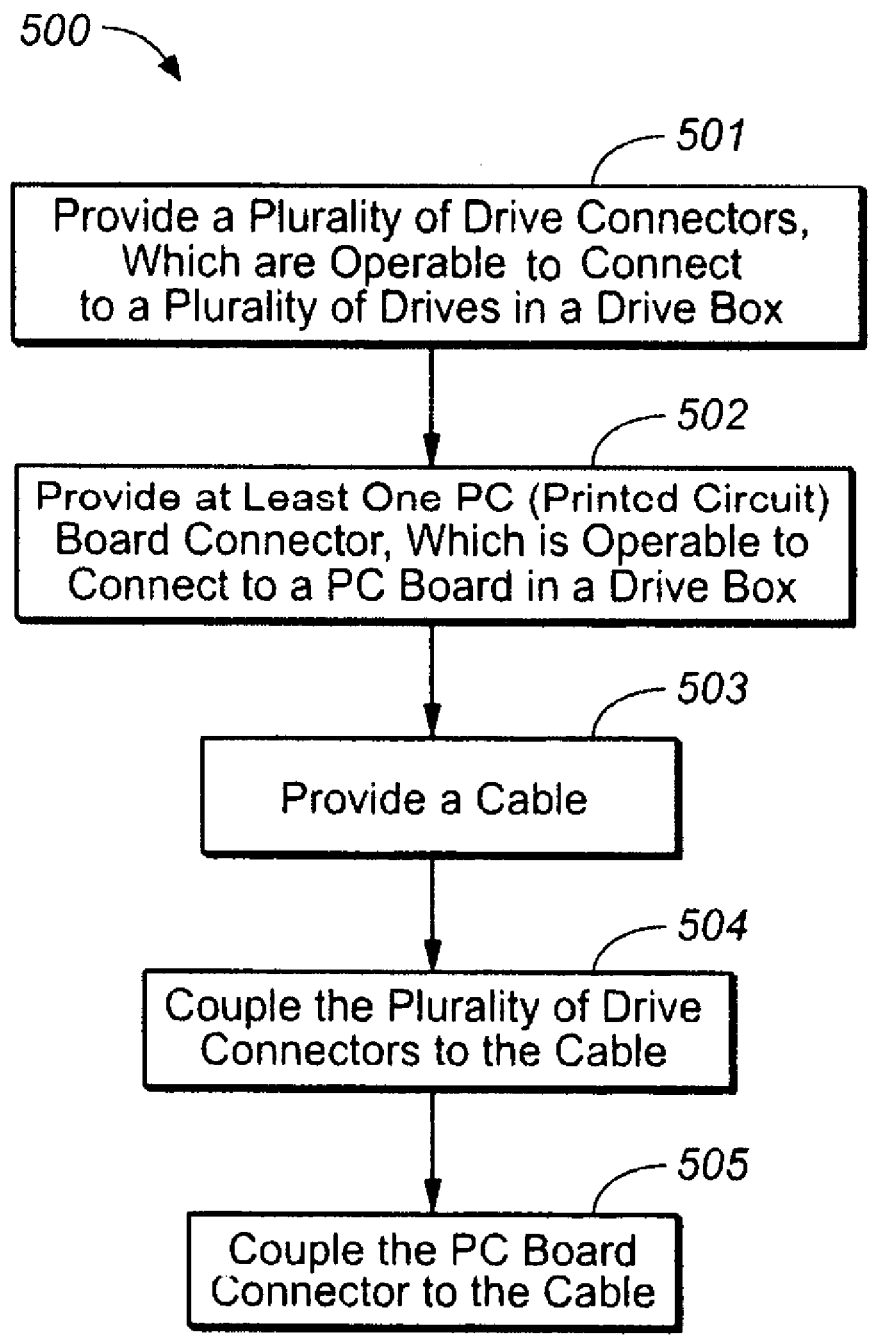
FIG. 5 is a flow chart of a method for providing a multiple drive plug-in cable for a drive box of an information handling system, in accordance with an exemplary embodiment of the present invention.

Referring now to FIG. 5, a method 500 for providing a multiple drive plug-in cable for a drive box of an information handling system, in accordance with an exemplary embodiment of the present invention, is illustrated. In step 501, a plurality of drive connectors, which are operable to connect to a plurality of drives in a drive box, are provided. In step 502, at least one PC board connector, which is operable to connect to a PC board in a drive box, is provided. In step 503, a cable is provided. The cable may comprise a shielded cable. The cable may be configured to occupy a minimal cross-sectional area in order to maximize air flow within the drive box. In step 504, the cable is coupled to the plurality of drive connectors. In step 505, the cable is coupled to the PC board connector. The multiple drive plug-in cable may be operable to provide power from a PC board to a plurality of drives within a drive box. The multiple drive plug-in cable may be operable to pass signal between the PC board and the plurality of drives. The multiple drive plug-in cable may be operable to provide power from the PC board to the plurality of drives and to pass signal between the PC board and the plurality of drives.

The present invention allows for assembly of drive boxes that stack drives more than one drive deep without requiring large numbers of PC boards or without requiring that the drive box to be pulled out of the rack to remove or replace the drives. The multiple drive plug-in cable of the present invention reduces the cost of manufacturing the drive box, reduces EMI, and prevents drops in signal integrity by reducing the number of PC boards required for a drive box. Further, utilization of shielding in the multiple drive plug-in cable of the present invention further reduces EMI.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An information handling system, comprising:
    a drive box mountable to a rack, the drive box comprising a plurality of drive plugs;
    a plurality of drives coupleable to the plurality of drive plugs;
    a PC (printed circuit) board internal to the drive box;
    a multiple drive plug-in cable configured for operably connecting the PC board and the plurality of drives, the multiple drive plug-in cable comprising a plurality of drive connectors for connecting the plurality of drives to the plurality of drive plugs, the multiple drive plug-in cable further comprising a plurality of PC board connectors corresponding to each of the plurality of drive connectors for connecting the multiple drive plug-in cable to the PC board;

the multiple drive plug-in cable comprises, a first distinct cable component configured for providing power from the PC board to the plurality of drives and a second distinct cable component configured for passing a data signal between the PC board and the plurality of drives; and the multiple drive plug-in cable further comprises a shielded cable having a shield comprising at least one of a braided strand of metal, a non-braided spiral winding of metal, or a layer of conductive polymer.

2. The drive box as claimed in claim 1, wherein the multiple drive plug-in cable is configured to occupy a minimal cross-sectional area in order to maximize airflow within the drive box.

* * * * *